United States Patent [19]

Sakurai et al.

[11] Patent Number: 4,497,539

[45] Date of Patent: Feb. 5, 1985

[54] ANTIREFLECTION OPTICAL COATING

[75] Inventors: Kunio Sakurai, Hino; Hiroshi Ito, Tachikawa; Takashi Nozaki, Hino, all of Japan

[73] Assignee: Konishiroku Photo Industry Co., Ltd., Tokyo, Japan

[21] Appl. No.: 432,989

[22] Filed: Oct. 6, 1982

[30] Foreign Application Priority Data

Oct. 7, 1981 [JP] Japan .................. 56-158797

[51] Int. Cl.³ .................................. G02B 1/10
[52] U.S. Cl. .................................. 350/164; 350/1.6
[58] Field of Search ................ 350/1.6, 164, 165, 166

[56] References Cited

U.S. PATENT DOCUMENTS 3,356,522 12/1967 Libbert ..................... 350/164

OTHER PUBLICATIONS

Cox et al., *Triple-Layer Antireflection Coatings...*, J. O. S. A., vol. 52, No. 9, Sep. 1962, pp. 965 to 969.

Primary Examiner—Bruce Y. Arnold
Assistant Examiner—William Propp
Attorney, Agent, or Firm—Jordan B. Bierman

[57] ABSTRACT

Recently, there has been the tendency to increasingly use optical machinery and devices which utilize optical parts made of synthetic resin. Since an antireflection coating film for these synthetic resin optical parts is high in adhesive strength and is hard, it is advantageous to use silicon oxide. Particularly, silicon monoxide (SiO) varies in refractive index by varying the evaporation condition, and therefore, it is possible to make use of such properties to produce a multi-layered antireflection coating film from a single evaporation material by varying the evaporation conditions.

6 Claims, 3 Drawing Figures

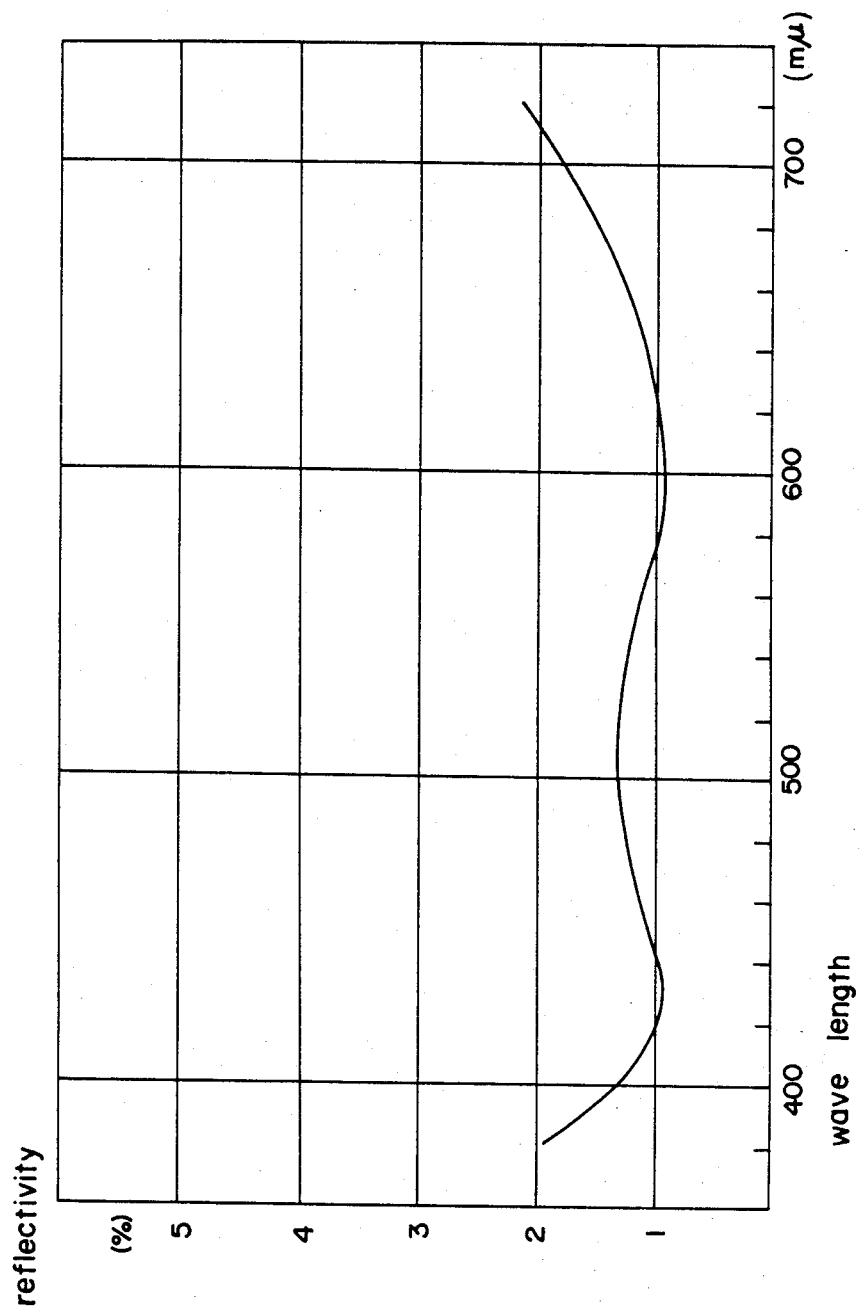

ANTIREFLECTION OPTICAL COATING

BACKGROUND OF THE INVENTION

1. Field of the Invention

This invention relates to an antireflection optical coating suitable for optical parts of relatively low refractive index, particularly for optical parts made of synthetic resin.

2. Description of the Prior Art

While recently, optical parts made of synthetic resin have been gradually used due to their ease of processing and lightweight, a problem still remains with respect to the antireflection properties of these optical parts.

For optical parts made of synthetic resin, particularly for lenses, silicon oxide is widely used as one of evaporation materials for the coating film. This results from the fact that the silicon oxide evaporation film relatively firmly adheres to the synthetic resin surface, and a hard film can be obtained without heating the resin part under vacuum.

In a well known optical coating using silicon oxide, silicon dioxide ($SiO_2$) film having the refractive index 1.46–1.48 is used as a first layer which is in contact with air. The bulk refractive index of $SiO_2$ is about 1.46 but the refractive index of the evaporation film is generally higher than the bulk refractive index due to the thermal decomposition during the course of evaporation. On the other hand, when the evaporation slowly takes place under an atmosphere of oxygen of about $10^{-4}$ Torr, using an electron gun for heating an evaporant, the refractive index of the evaporation film can come closer to the bulk refractive index. However, even if the refractive index of the evaporation film becomes the same as the bulk refractive index, it is not possible to achieve a sufficient antireflection effect as long as a single layer of $SiO_2$ is used.

Generally, in the antireflection films, the amplitude condition cannot be satisfied unless the refractive index $n_1$ of the first layer film in contact with air is smaller than the refractive index $n_s$ of a substrate. For example, in a single layer antireflection coating ($n_0/4$), in case $n_1 = n_0\sqrt{n_s}$ (where, $n_o$ is the refractive index of refraction of air) is satisfied, the reflectivity is zero at the center wavelength (No).

Synthetic resins used for optical parts are transparent resins such as polymethyl methacrylate (PMMA) $n=1.49$, diallyl glycol carbonate (CR39) $n=1.50$, polystyrene (PS) $n=1.59$, acrylonitrile-styrene (AS) $n=1.57$, polycarbonate (PC) $n=1.58$, etc., which however, cannot satisfy the aforesaid amplitude condition with the refractive index of $SiO_2$. Particularly, with respect to the resins such as PMMA, CR39, etc. of low refractive index of refraction which are often used, the $SiO_2$ single layer coating makes it hardly possible to attain the desired antireflection effect.

For the above reasons, if an attempt is made to obtain a multi-layer film more of than two layers, more than two kinds of evaporation materials must be used, and a plurality of evaporation sources must be set within an evaporation tank and, in addition, if $SiO_2$ is used, an electron gun must be used as a source of evaporation, thus resulting in a complicated process for manufacture, which results in high costs.

SUMMARY OF THE INVENTION

This invention is intended to provide an antireflection coating film particularly suitable for optical parts made of synthetic resin, in which only silicon monoxide (SiO) is used both as an evaporation material and a substantial multi-layer film is formed easily and inexpensively by a conventional source of resistance heating evaporation.

It is well known that silicon monoxide SiO largely varies in refractive index of an evaporation film depending on the evaporation conditions, particularly on the degree of vacuum and deposition speed. FIG. 1 is a graph showing the variation in refractive index of SiO evaporation film with the rate set to constant (5 /sec) with the pressure of oxygen gas varied, and FIG. 2 is a similar graph with the pressure of oxygen gas set to constant and the deposition speed varied. It is apparent from these graphs that in SiO evaporation film, the refractive index may be varied in the range of approximately 1.50 to 1.90 but not above 1.50, and the refractive index thereof is not lowered as $SiO_2$ evaporation film.

Accordingly, in case the antireflection film using SiO is used, even if SiO film of the lowest index of refraction n=150–1.55 should be used as a first layer, this refractive index is substantially equal to or rather higher than that of PMMA and CR39, and it is therefore totally impossible for such a single layer coating to obtain the antireflection effect. Therefore, it becomes necessary to provide an evaporation film at least having a higher refractive index than that of the first layer and the substrate between the first layer film and the substrate.

The structure usually used as a multilayer antireflection film includes:

| | |
|---|---|
| a | $\frac{\lambda}{4}$ film + $\frac{\lambda}{4}$ film |
| b | $\frac{\lambda}{4}$ film + $\frac{\lambda}{2}$ film |
| c | $\frac{\lambda}{4}$ film + $\frac{\lambda}{2}$ film + $\frac{\lambda}{4}$ film |

In any case, the use of the film of n=1.50–1.55 as the $\lambda/4$ film of the first layer often deteriorates the antireflection effect. For the $\lambda/2$ film in b and c above, a film of high refractive index of more or less 2.0 is generally used, but in case of SiO film, the refractive index thereof is, say, about 1.9 at the highest. When the refractive index is about 1.85 or more, absorption at the visual light, particularly at the short wavelength becomes large even if the film thickness is $\lambda/4$, which is not suitable for practical use as the antireflection film. For this reason, the aforementioned structure of the multilayer coating cannot be used.

In accordance with this invention, a multilayer coating having a good antireflection effect is obtained using an SiO evaporation film having the refractive index in the range of n=1.50 to 1.85.

BRIEF DESCRIPTION OF THE DRAWINGS

FIG. 3 is a graph showing the spectral reflectance of one embodiment of the antireflection film in accordance this invention.

DETAILED DESCRIPTION OF THE PREFERRED EMBODIMENT

Figure 1:
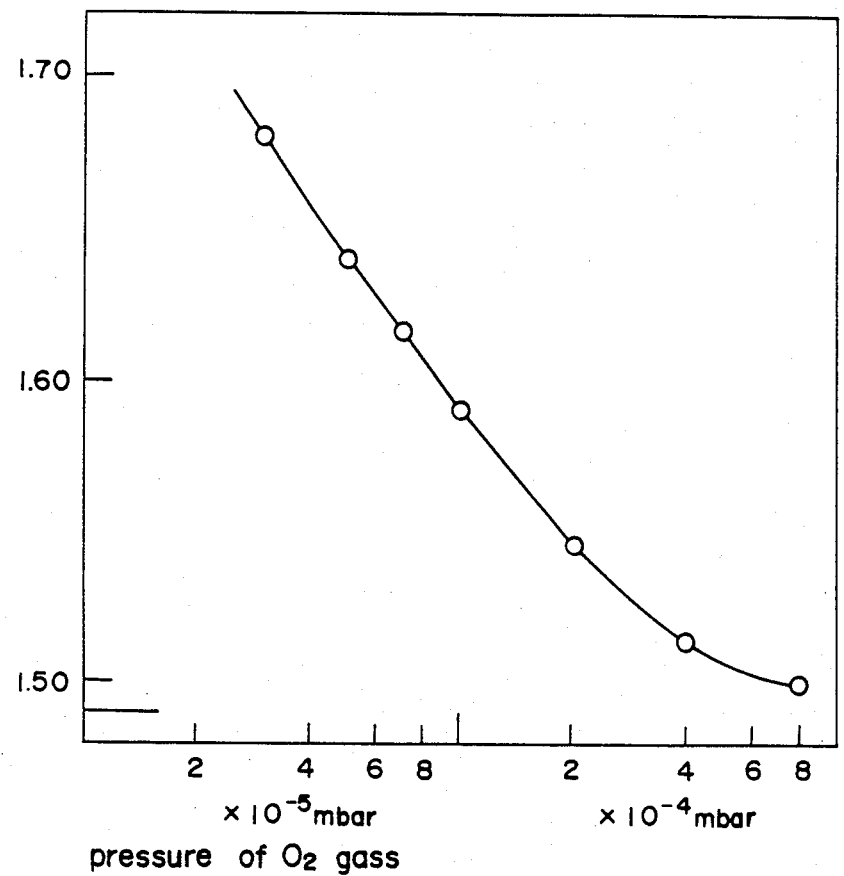
FIG. 1 is a graph showing the relation between the refractive index of a SiO evaporation film and the pressure of atmospheric oxygen gas.
Figure 2:
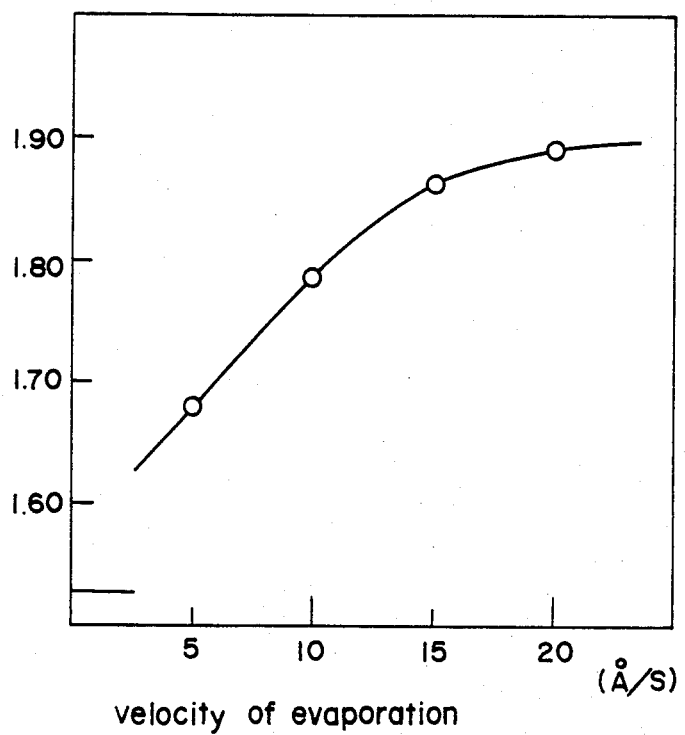
FIG. 2 is likewise a graph showing the refractive index and the evaporation rate.

We have found that the good antireflection effect may be obtained by the multilayer coating having the structure noted below.

EXAMPLE 1

|  | Refractive Index | Film Thickness |
|---|---|---|
| First layer | 1.50–1.55 | λ/4 (0.125) |
| Second layer | 1.75–1.83 | λ/4 |
| Third layer | 1.60–1.68 | λ/4 |
| Substrate | $n_s = 1.49-1.60$ | |

In this Example, if the refractive index of the first layer exceeds 1.55, a difference between the first and second layers in refractive index is small with the result that the reflectivity in the entire visible region increases. If the refractive index of the second layer is less than 1.75, the reflectance particularly in the center of the visible region increases, and if exceeding 1.83, the absorption of the SiO film increases. If the refractive index in the third layer exceeds 1.68, the reflectance in the center of the visible region increases, and if it is below 1.60, the reflectance in the circumferential portion of the visible region increases, and either case is not favorable for practical use.

FIG. 3 shows the spectral reflectivity where the refractive indices of the first, second and third layers are respectively set to 1.50, 1.83 and 1.68 with PMMA ($n_s=1.49$) used as the substrate, having a high antireflection effect over the entire visible region.

EXAMPLE 2

|  | Refractive Index | Film Thickness |
|---|---|---|
| First layer | 1.50–1.55 | λ/4 |
| Second layer | $n_{21}$–$n_{25}$ | λ/2 |
| Substrate | $n_3 = 1.49-1.60$ | | where $n_{21}$: Refractive power of the second layer in a boundary with respect to the first layer: $1.80 \leq n_{21} \leq 1.85$
$n_{2s}$: Refractive power of the second layer in a boundary with respect to the substrate: $1.60 \leq n_{2s} \leq 1.68$.

In this Example, the refractive index in the second layer varies so that the refractive index continuously increases from the substrate side towards the first layer side, which is so-called the non-uniform film. The range of the refractive index of both layers is restricted for the same reason as that of Example 1 but the upper limit of the second layer capable of being used is up to the range where the absorption is somewhat greater than that of Example 1 since the thickness thereof is substantially extremely small.

The refractive index of the second layer in a boundary with respect to the substrate is suitably in the range from 1.60 to 1.68 and gradually increases towards the first layer, and the refractive index of the second layer in a boundary with respect to the first layer is suitably in the range from 1.80 to 1.85.

The refractive power in a boundary with respect to the substrate of the second layer is in the range from 1.60 to 1.68, the refractive power gradually increasing towards the first layer and will be in the range from 1.80 to 1.85 in a boundary with respect to the first layer.

In the above-described Example, even if in the second and third layers of Example 1, the film thickness is further divided into a plurality of layers in which the refractive index is successively varied, it is not essentially different from the aforementioned both Examples and the antireflection effect obtained is also equivalent thereto.

It will be noted that in order to further increase the hardness of the surface of synthetic resin parts, a SiO evaporation film of about 1–3μ thickness having substantially the same refractive index as that of the substrate can be provided as a layer in contact with the substrate and a multilayer coating of the present invention is placed thereon.

In this invention, a described hereinbefore, an evaporation film formed of only SiO whose antireflection effect is extremely low as a single layer coating is used to form a substantially multilayer coating to obtain the high antireflection effect. In addition, since the refractive index of each layer may be varied only by varying the velocity of evaporation or pressure of atmospheric oxgen gas, the control thereof can be achieved extremely readily. Moreover, a conventional resistance heating device can be used as a source of evaporation. Thus, the antireflection coating film of the present invention has a materially high practical value as is apparent from the foregoing advantages.

What is claimed is:

1. A multilayer antireflection film for optical parts made of synthetic resin consisting essentially of a plurality of superimposed evaporation films of silicon monoxide, each film having a different refractive index resulting from different evaporation conditions.

2. An antireflection film according to claim 1 characterized in that the refractive index of a first layer on the side of air is 1.50 to 1.55.

3. An antireflection film according to claim 2 having the following structure:

|  | Refractive Index | Film Thickness |
|---|---|---|
| First layer | 1.50–1.55 | λ/4 |
| Second layer | 1.75–1.83 | λ/4 |
| Third layer | 1.60–1.68 | λ/4 |
| Substrate | $n_s = 1.49-1.60$ | |

4. An antireflection film according to claim 2, having the following structure:

|  | Refractive Index | Film Thickness |
|---|---|---|
| First layer | 1.50–1.55 | λ/4 |
| Second layer | $n_{21}$–$n_{25}$ | λ/2 |
| Substrate | $n_3 = 1.49-1.60$ | | where $n_{21}$: Refractive power of the second layer in a boundary with respect to the first layer: $1.80 \leq n_{21} \leq 1.85$
$n_{2s}$: Refractive power of the second layer in a boundary with respect to the substrate: $1.60 \leq n_{2s} \leq 1.68$.

5. A multilayer antireflection film for optical parts made of synthetic resin which is composed of a plurality of superimposed evaporation films of silicon monoxide, each film having a different refractive index resulting from different evaporation conditions, said film having the following structure:

|  | Refractive Index | Film Thickness |
|---|---|---|
| First layer | 1.50–1.55 | $\lambda/4$ |
| Second layer | 1.75–1.83 | $\lambda/4$ |
| Third layer | 1.60–1.68 | $\lambda/4$ |
| Substrate | $n_s = 1.49–1.60$ | |

6. A multilayer antireflection film for optical parts made of synthetic resin which is composed of a plurality of superimposed evaporation films of silicon monoxide, each film having a different refractive index resulting from different evaporation conditions, said film having the following structure:

|  | Refractive Index | Film Thickness |
|---|---|---|
| First Layer | 1.50–1.55 | $\lambda/4$ |
| Second Layer | $n_{21}$–$n_{2s}$ | $\lambda/2$ |
| Substrate | $n_3 = 1.49–1.60$ | | where
$n_{21}$: Refractive power of the second layer in a boundary with respect to the first layer: $1.80 \leq n_{21} \leq 1.85$
$n_{2s}$: Refractive power of the second layer in a boundary with respect to the substrate: $1.60 \leq n_{2s} \leq 1.68$.

* * * * *